(12) United States Patent
Choi et al.

(10) Patent No.: US 9,941,345 B2
(45) Date of Patent: Apr. 10, 2018

(54) ORGANIC LIGHT EMITTING DIODE DISPLAY HAVING BLOCKING LAYER EXTENDING FROM A DRAIN ELECTRODE

(71) Applicant: Samsung Display Co., Ltd., Yongin-si, Gyeonggi-do (KR)

(72) Inventors: Jun Won Choi, Cheonan-si (KR); Se-Ho Kim, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 56 days.

(21) Appl. No.: 15/230,206

(22) Filed: Aug. 5, 2016

(65) Prior Publication Data

US 2017/0040408 A1    Feb. 9, 2017

(30) Foreign Application Priority Data

Aug. 7, 2015    (KR) .................. 10-2015-0111684

(51) Int. Cl.
*H01L 27/32* (2006.01)
*G09G 3/3225* (2016.01)
(Continued)

(52) U.S. Cl.
CPC ....... *H01L 27/3276* (2013.01); *G09G 3/3225* (2013.01); *H01L 27/3262* (2013.01); (Continued)

(58) Field of Classification Search
CPC ............. H01L 27/3276; H01L 51/5253; H01L 51/5281; G06F 3/0412
See application file for complete search history.

(56) References Cited

U.S. PATENT DOCUMENTS 8,076,733 B2 * 12/2011 Lee .................. H01L 51/105
257/401
2013/0001577 A1 * 1/2013 Kim .................. H01L 29/45
257/71
(Continued)

FOREIGN PATENT DOCUMENTS

KR         10-1103615 B1    1/2012
KR     10-2013-0110987 A    10/2013
(Continued)

*Primary Examiner* — Alonzo Chambliss
(74) *Attorney, Agent, or Firm* — Knobbe Martens Olson & Bear LLP

(57) ABSTRACT

An organic light-emitting diode (OLED) display is disclosed. In one aspect, the OLED display includes a scan line configured to transmit a scan signal and a data line crossing the scan line and configured to transmit a data voltage. The OLED display also includes a driving voltage line crossing a scan line and configured to transmit a driving voltage, a switching transistor connected to the scan and data lines, and a driving transistor connected to the switching transistor and including a driving gate electrode configured to function as a first storage electrode. The OLED display further includes a second storage electrode overlapping the first storage electrode and an expansion portion of the driving voltage line, an OLED electrically connected to the driving transistor and a blocking layer extending from the driving drain electrode and overlapping a portion of the data.

20 Claims, 8 Drawing Sheets

(51) Int. Cl.
  *H01L 51/52*      (2006.01)
  *H01L 27/12*      (2006.01)
(52) U.S. Cl.
  CPC ...... *H01L 27/3265* (2013.01); *H01L 51/5253* (2013.01); *H01L 51/5281* (2013.01); *G09G 2300/0809* (2013.01); *G09G 2310/0262* (2013.01); *G09G 2320/0214* (2013.01); *H01L 27/124* (2013.01); *H01L 27/1255* (2013.01); *H01L 27/3279* (2013.01)

(56) References Cited

U.S. PATENT DOCUMENTS

2014/0139772 A1* 5/2014 Kim .................. H01L 27/3258
                                                  349/43
2015/0123134 A1* 5/2015 Wang ................ H01L 27/14649
                                                  257/72
2015/0357393 A1* 12/2015 Kwon ................ H01L 33/0041
                                                  257/40

FOREIGN PATENT DOCUMENTS

KR    10-2014-0018623 A    2/2014
KR    10-2014-0077002 A    6/2014

* cited by examiner

ORGANIC LIGHT EMITTING DIODE DISPLAY HAVING BLOCKING LAYER EXTENDING FROM A DRAIN ELECTRODE

CROSS-REFERENCE TO RELATED APPLICATION

This application claims priority to and the benefit of Korean Patent Application No. 10-2015-0111684 filed in the Korean Intellectual Property Office on Aug. 7, 2015, the entire contents of which are incorporated herein by reference.

BACKGROUND

Field

The present disclosure generally relates to an organic light-emitting diode display.

Description of the Related Technology

An organic light-emitting diode (OLED) display includes two electrodes and an interposed organic light-emitting layer. Electrons injected from a cathode electrode and holes injected from an anode electrode bind to each other in the organic light-emitting layer to form excitons. Light is emitted while the excitons discharge energy.

An OLED display includes multiple pixels each including an OLED that includes the cathode and anode electrodes and the organic light-emitting layer. Each pixel is a pixel circuit including multiple transistors and capacitors for driving the OLED. The basic set of transistors include a switching transistor and a driving transistor.

Vertical crosstalk, which is referred to as a change of luminance of the OLED, occurs due to parasitic capacitance formed between a driving gate node connected to a driving gate electrode of a driving transistor, and a data line.

The above information disclosed in this Background section is only to enhance the understanding of the background of the invention and therefore it may contain information that does not form the prior art that is already known in this country to a person of ordinary skill in the art.

SUMMARY OF CERTAIN INVENTIVE ASPECTS

One inventive aspect relates to an OLED display that can prevent vertical crosstalk.

Another aspect is an OLED display that includes: a substrate; a scan line disposed on the substrate and transmitting a scan signal; a data line crossing the scan line and transmitting a data voltage; a driving voltage line crossing the scan line and transmitting a driving voltage; a switching transistor connected to the scan line and the data line; a driving transistor connected to the switching transistor and including a driving gate electrode, a driving source electrode, and a driving drain electrode; a second storage electrode overlapping a first storage electrode that is the driving gate electrode and an expansion portion of the driving voltage line; an OLED electrically connected to the driving transistor; and a blocking member expanding from the driving drain electrode and overlapping a portion of the data line.

The data line may include a current data line transmitting a data signal to a current pixel and an adjacent data line transmitting an adjacent data signal to an adjacent pixel adjacent to the current pixel, and the blocking member overlaps a portion of the adjacent data line.

The adjacent data line may be shifted to the blocking member.

The OLED display may further include a semiconductor member disposed on the substrate and including a switching channel of the switching transistor and a driving channel of the driving transistor disposed to be separated from each other, wherein the driving channel may overlap the driving gate electrode and the driving channel may be curved in a plan view.

The blocking member may be disposed on the same layer as the driving channel.

The OLED display may further include a gate insulating layer covering the semiconductor member and an interlayer insulating layer covering the gate insulating layer, wherein the scan line may be disposed on the same layer as the first storage electrode, and the data line and the second storage electrode may be disposed on the interlayer insulating layer.

The driving voltage line may include a first driving voltage line parallel with the data line and a second driving voltage line crossing the data line, and the first driving voltage line may be disposed on the same layer as the data line and the second driving voltage line may be disposed on the same layer as the scan line.

The OLED may include a pixel electrode electrically connected to the driving transistor, an organic emission layer disposed on the pixel electrode, and a common electrode disposed on the organic emission layer, and may further include an initialization voltage line disposed on the same layer as the pixel electrode and transmitting an initialization voltage initializing the driving transistor.

The OLED display may further include a previous scan line parallel with the scan line and transmitting a previous scan signal, and an initialization transistor turned on according to the previous scan signal and transmitting the initialization voltage to the driving gate electrode, wherein the initialization transistor may be disposed in a current flow path between the initialization voltage line and the driving gate electrode.

The initialization transistor may include a current initialization transistor disposed in the current pixel and an adjacent initialization transistor disposed in the adjacent pixel, the first driving voltage line may include a current first driving voltage line disposed in the current pixel and an adjacent first driving voltage line disposed in the adjacent pixel, and the current initialization transistor may be separated from the current first driving voltage line in a plan view while the adjacent initialization transistor overlaps the adjacent first driving voltage line.

Another aspect is an organic light-emitting diode (OLED) display comprising: a substrate; a scan line disposed on the substrate and configured to transmit a scan signal; a data line crossing the scan line and configured to transmit a data voltage; a driving voltage line crossing the scan line and configured to transmit a driving voltage; a switching transistor connected to the scan line and the data line; a driving transistor connected to the switching transistor and including a driving gate electrode, a driving source electrode, and a driving drain electrode, wherein the driving gate electrode is configured to function as a first storage electrode; a second storage electrode overlapping the first storage electrode and an expansion portion of the driving voltage line in the depth dimension of the OLED display; an OLED electrically connected to the driving transistor; and a blocking layer extending from the driving drain electrode and overlapping a portion of the data line in the depth dimension of the OLED display.

In the above OLED display, the data line includes a current data line configured to transmit a data signal to a current pixel and an adjacent data line configured to transmit an adjacent data signal to an adjacent pixel adjacent to the current pixel, and wherein the blocking layer overlaps a portion of the adjacent data line in the depth dimension of the OLED display. In the above OLED display, the adjacent data line is shifted to the blocking layer. The above OLED display further comprises a semiconductor member disposed on the substrate and including a switching channel of the switching transistor and a driving channel of the driving transistor separated from each other, wherein the driving channel overlaps the driving gate electrode in the depth dimension of the OLED display and wherein the driving channel is curved in a plan view.

In the above OLED display, the blocking layer is disposed on the same layer as the driving channel. The above OLED display further comprises: a gate insulating layer covering the semiconductor member; and an interlayer insulating layer covering the gate insulating layer, wherein the scan line is disposed on the same layer as the first storage electrode, and wherein the data line and the second storage electrode are disposed on the interlayer insulating layer. In the above OLED display, the driving voltage line includes a first driving voltage line parallel with the data line and a second driving voltage line crossing the data line, wherein the first driving voltage line is disposed on the same layer as the data line and wherein the second driving voltage line is disposed on the same layer as the scan line. In the above OLED display, the OLED includes: a pixel electrode electrically connected to the driving transistor; an organic emission layer disposed on the pixel electrode; and a common electrode disposed on the organic emission layer, wherein the OLED display further comprises an initialization voltage line disposed on the same layer as the pixel electrode and configured to transmit an initialization voltage initializing the driving transistor.

The above OLED display further comprises: a previous scan line parallel with the scan line and configured to transmit a previous scan signal; and an initialization transistor turned on according to the previous scan signal and configured to transmit the initialization voltage to the driving gate electrode, wherein the initialization transistor is disposed in a current flow path between the initialization voltage line and the driving gate electrode. In the above OLED display, the initialization transistor includes a current initialization transistor disposed in the current pixel and an adjacent initialization transistor disposed in the adjacent pixel, wherein the first driving voltage line includes a current first driving voltage line disposed in the current pixel and an adjacent first driving voltage line disposed in the adjacent pixel, and wherein the current initialization transistor is separated from the current first driving voltage line in a plan view and the adjacent initialization transistor overlaps the adjacent first driving voltage line in the depth dimension of the OLED display.

In the above OLED display, the driving drain electrode has two opposing ends, and wherein the blocking layer extends from only one of the two ends of the driving drain electrode. In the above OLED display, the blocking layer extends in a direction to be farther away from the first storage electrode. In the above OLED display, the blocking layer does not overlap the second storage electrode in the depth dimension of the OLED display. In the above OLED display, the blocking layer at least partially overlaps the OLED in the depth dimension of the OLED display. In the above OLED display, the blocking layer has a thickness which is the same as that of the driving drain electrode. In the above OLED display, the blocking layer and the driving drain electrode are covered by the same insulating layer.

Another aspect is an organic light-emitting diode (OLED) display comprising: a data line configured to transmit a data voltage; a driving voltage line configured to transmit a driving voltage; a driving transistor including a driving gate electrode, a driving source electrode, and a driving drain electrode, wherein the driving gate electrode is configured to function as a first storage electrode; a second storage electrode overlapping the first storage electrode and an expansion portion of the driving voltage line in the depth dimension of the OLED display; an OLED electrically connected to the driving transistor; and a blocking layer extending from the driving drain electrode and overlapping a portion of the data line in the depth dimension of the OLED display.

In the above OLED display, the driving drain electrode has two opposing ends, and wherein the blocking layer extends only from one of the two ends of the driving drain electrode. In the above OLED display, the blocking layer at least partially overlaps the OLED in the depth dimension of the OLED display. In the above OLED display, the blocking layer and the driving drain electrode are covered by the same insulating layer.

According to at least one of the disclosed embodiments, parasitic capacitance formed between an adjacent data line and a driving gate node is blocked, thereby avoiding or minimizing vertical crosstalk.

DETAILED DESCRIPTION OF CERTAIN INVENTIVE EMBODIMENTS

Figure 1:
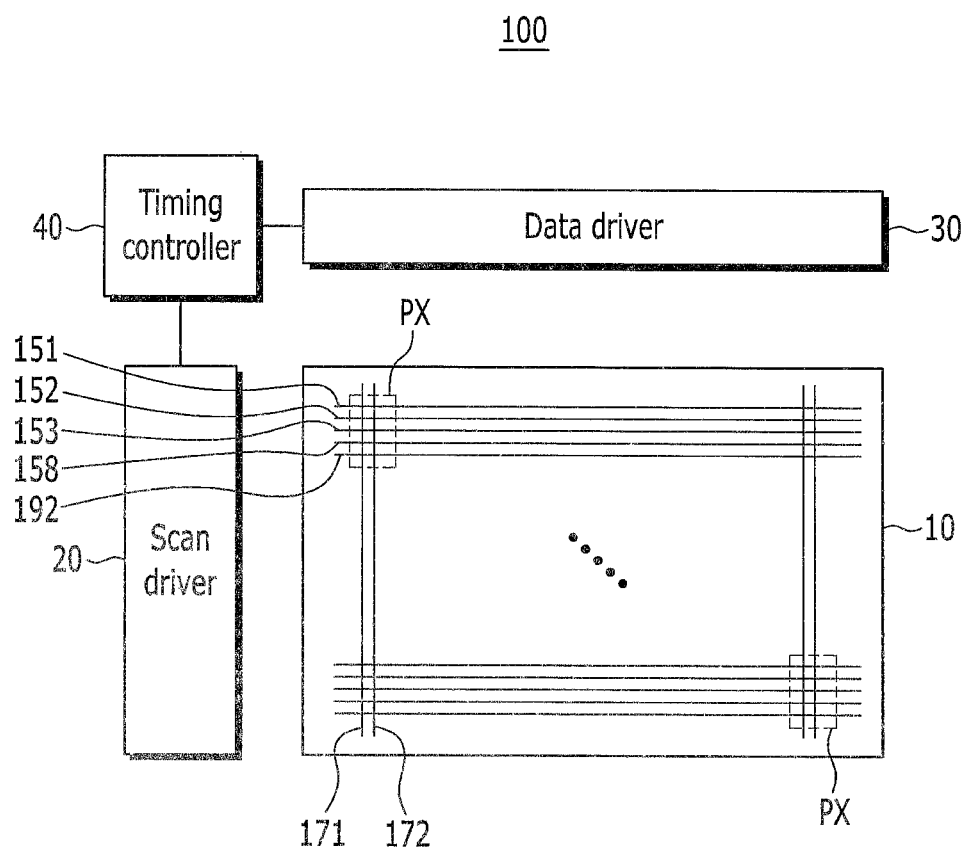
FIG. 1 is a schematic view of an OLED display according to an exemplary embodiment of the present disclosure.

Embodiments will be described more fully hereinafter with reference to the accompanying drawings, in which exemplary embodiments are shown. As those skilled in the art would realize, the described embodiments may be modified in various different ways, all without departing from the spirit or scope of the present disclosure.

In order to clearly describe the present disclosure, portions that are not connected with the description will be omitted. Like reference numerals designate like elements throughout the specification.

In addition, in the drawings, a size and thickness of each element are randomly represented for better understanding and ease of description, and the present disclosure is not limited thereto. In the drawings, the thickness of layers, films, panels, regions, etc., are exaggerated for clarity. In the drawings, the thicknesses of some layers and areas are exaggerated for convenience of explanation.

In addition, unless explicitly described to the contrary, the word "comprise" and variations such as "comprises" or "comprising" will be understood to imply the inclusion of stated elements but not the exclusion of any other elements.

Further, it will be understood that when an element such as a layer, film, region, or substrate is referred to as being "on" another element, it can be directly on the other element or intervening elements may also be present.

In the specification, the word "on" means positioning on or below the object portion, but does not necessarily mean positioning on the upper side of the object portion based on a gravitational direction.

In the specification, the phrase "in a plan view" means when an object portion is viewed from above, and the phrase "in cross-section" means when a cross-section taken by vertically cutting an object portion is viewed from the side.

In addition, the present disclosure is not limited to the number of transistors and capacitors illustrated in the accompanying drawings, and in the OLED display, each pixel may be provided with a plurality of transistors and at least one capacitor, and may be formed to have various structures by further forming additional wires or omitting existing wires.

In this case, a pixel means a minimum unit which displays an image, and the organic light-emitting device displays an image through a plurality of pixels.

Hereinafter, an OLED display according to an exemplary embodiment of the present disclosure will be described with reference to the accompanying drawings. In this disclosure, the term "substantially" includes the meanings of completely, almost completely or to any significant degree under some applications and in accordance with those skilled in the art. Moreover, "formed, disposed over positioned over" can also mean "formed, disposed or positioned on." The term "connected" includes an electrical connection.

Figure 2:
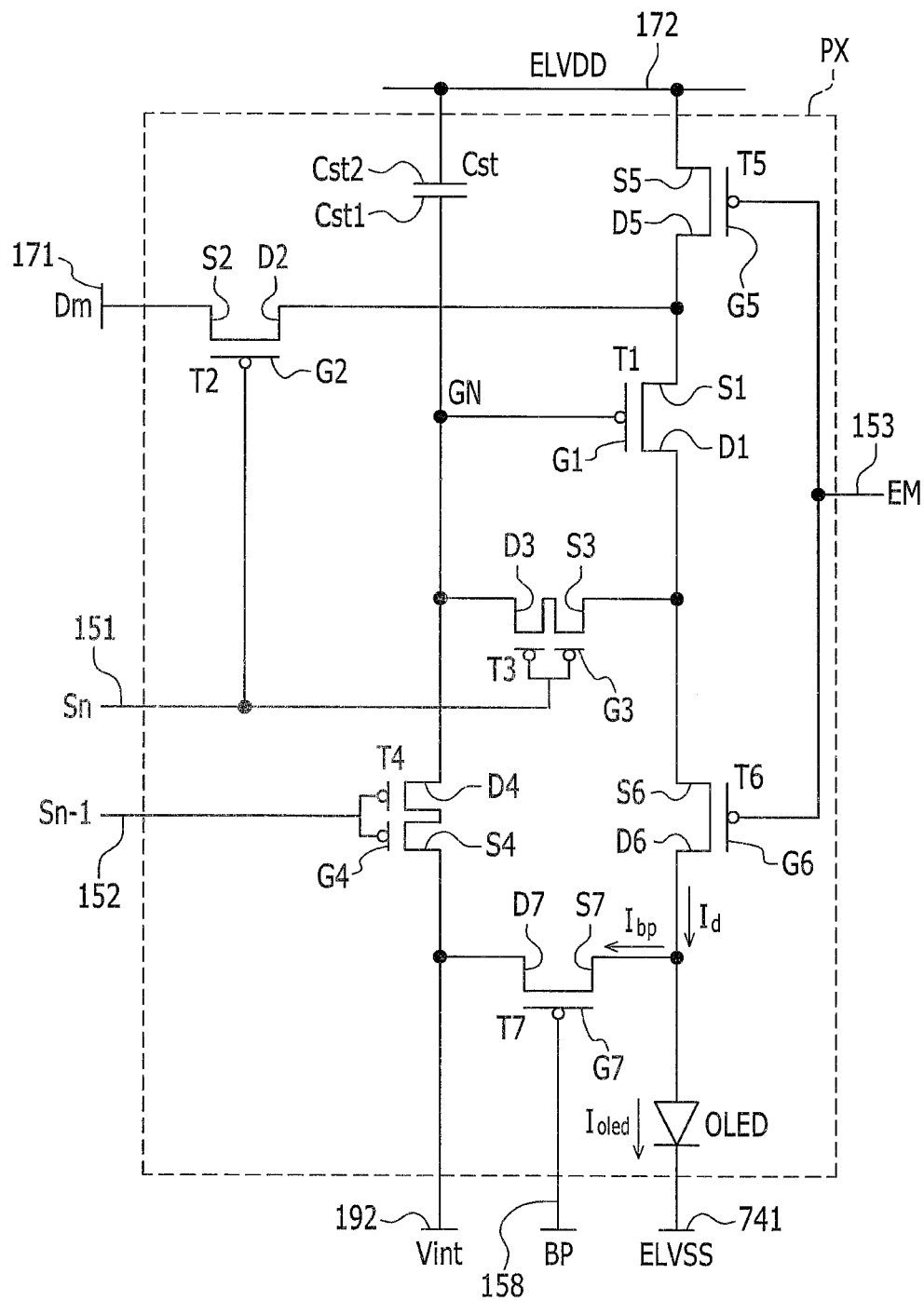
FIG. 2 is an equivalent circuit diagram of a pixel of an OLED display according to an exemplary embodiment of the present disclosure.

FIG. 1 is a schematic view of an OLED display 100 according to an exemplary embodiment of the present disclosure, and FIG. 2 is an equivalent circuit diagram of a pixel of the OLED display 100 of FIG. 1.

As shown in FIG. 1, the OLED display 100 includes an organic light-emitting display panel 10 displaying an image, a scan driver 20, a data driver 30, and a timing controller 40.

The organic light-emitting display panel 10 may include a plurality of signal lines 151, 152, 153, 158, 171, 172, and 192, and a plurality of pixels PX arranged in a matrix and connected to the signal lines.

As shown in FIG. 2, one pixel PX may include a plurality of transistors T1, T2, T3, T4, T5, T6, and T7, a storage capacitor Cst, and an OLED, which are connected to the signal lines 151, 152, 153, 158, 171, 172, and 192.

The transistors T1, T2, T3, T4, T5, T6, and T7 may include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 may include a plurality of scan lines 151, a plurality of previous scan lines 152, a plurality of light emission control lines 153, a plurality of bypass control lines 158, a plurality of data lines 171, a plurality of driving voltage lines 172, and a plurality of initialization voltage lines 192.

The scan line may transmit a scan signal Sn, the previous scan line 152 may transmit a previous scan signal Sn-1 to the initialization transistor T4, the light emission control line 153 may transmit a light emission control signal EM to the operation control transistor T5 and the light emission control transistor T6, and the bypass control line 158 may transmit a bypass signal BP to the bypass transistor T7.

The data line 171 may cross the scan line 151 and may transmit a data signal Dm, the driving voltage line 172 may be substantially parallel to the data line 171 and may transmit a driving voltage ELVDD, and the initialization voltage line 192 may transmit an initialization voltage Vint initializing the driving transistor T1.

Each of the scan line 151, the previous scan line 152, the light emission control line 153, the bypass control line 158, the data line 171, the driving voltage line 172, and initialization voltage line 192 may be connected to one pixel.

A gate electrode G1 of the driving transistor T1 may be connected to one end Cst1 of the storage capacitor Cst, a source electrode S1 of the driving transistor T1 may be connected to the driving voltage line 172 via the operation control transistor T5, and a drain electrode D1 of the driving transistor T1 may be electrically connected to an anode of the OLED via the light emission control transistor T6.

The driving transistor T1 may receive the data signal Dm according to a switching operation of the switching transistor T2 to supply a driving current Id to the OLED.

A gate electrode G2 of the switching transistor T2 may be connected to the scan line 151, a source electrode S2 of the switching transistor T2 may be connected to the data line 171, and a drain electrode D2 of the switching transistor T2 may be connected to the source electrode S1 of the driving transistor T1 and to the driving voltage line 172 via the operation control transistor T5.

The switching transistor T2 may perform a switching operation so as to be turned on according to the scan signal Sn received through the scan line 151 to transmit the data signal Dm transmitted to the data line 171 to the source electrode of the driving transistor T1.

A gate electrode G3 of the compensation transistor T3 may be directly connected to the scan line 151, a source electrode S3 of the compensation transistor T3 may be connected to the drain electrode D1 of the driving transistor T1 and to an anode of the OLED via the light emission control transistor T6, and a drain electrode D3 of the compensation transistor T3 may be connected to one end Cst1 of the storage capacitor Cst and the drain electrode D4 of the initialization transistor T4, together with the gate electrode G1 of the driving transistor T1.

The compensation transistor T3 may be turned on according to the scan signal Sn received through the scan line 151 to connect the gate electrode G1 and the drain electrode D1 of the driving transistor T1 and to diode-connect the driving transistor T1.

A gate electrode G4 of the initialization transistor T4 may be connected to the previous scan line 152, a source electrode S4 of the initialization transistor T4 may be connected to an initialization voltage line 192, and a drain electrode D4 of the initialization transistor T4 may be connected to both one end Cst1 of the storage capacitor Cst and the gate electrode G1 of the driving transistor T1 via the drain electrode D3 of the compensation transistor T3. The initialization transistor T4 may perform an initialization operation so as to be turned on according to the previous scan signal Sn-1 received through the previous scan line 152 to transmit the initialization voltage Vint to the gate electrode G1 of the driving transistor T1 and then to initialize a gate voltage of the gate electrode G1 of the driving transistor T1.

A gate electrode G5 of the operation control transistor T5 may be connected to the light emission control line 153, a source electrode S5 of the operation control transistor T5 may be connected to the driving voltage line 172, and a drain electrode D5 of the operation control transistor T5 may be connected to the source electrode S1 of the driving transistor T1 and the drain electrode S2 of the switching transistor T2.

A gate electrode G6 of the light emission control transistor T6 may be connected to the light emission control line 153, the source electrode S6 of the first light emission control transistor T6 may be connected to the drain electrode D1 of the driving transistor T1 and the source electrode S3 of the compensation transistor T3, and the drain electrode D6 of the first light emission control transistor T6 may be electrically connected to the anode of the OLED.

The operation control transistor T5 and the first light emission control transistor T6 may be substantially simultaneously or concurrently turned on according to the light emission control signal EM transmitted to the light emission control line 153 such that the driving voltage ELVDD is compensated by using the diode-connected driving transistor T1 and is transmitted to the OLED.

A gate electrode G7 of the bypass transistor T7 may be connected to the bypass control line 158, a source electrode S7 of the bypass transistor T7 may be connected to both the drain electrode D6 of the light emission control transistor T6 and the anode of the OLED, and a drain electrode D7 of the bypass transistor T7 may be connected to both the initialization voltage line 192 and the source electrode S4 of the initialization transistor T4.

The other end Cst2 of the capacitor Cst may be connected to the driving voltage line 172, and a cathode of the OLED may be connected to a common voltage line 741 transmitting a common voltage ELVSS.

The scan driver 20 may transmit the scan signal Sn to a plurality of scan lines 151, and the data driver 30 may transmit the data signal Dm to a plurality of data lines 171.

The timing controller 40 may receive various control signals and image signals from an external system (not shown), and generate a scan control signal, a data control signal, and RGB signals to transmit them to the scan driver 20 and the data driver 30.

In the present embodiment, the seven-transistor and one-capacitor structure is illustrated, but the present disclosure is not limited thereto, and the number of transistors and the number of capacitors may be variously changed.

Hereinafter, a detailed operation process of one pixel of the OLED display will be described in detail with reference to FIG. 3.

Figure 3:
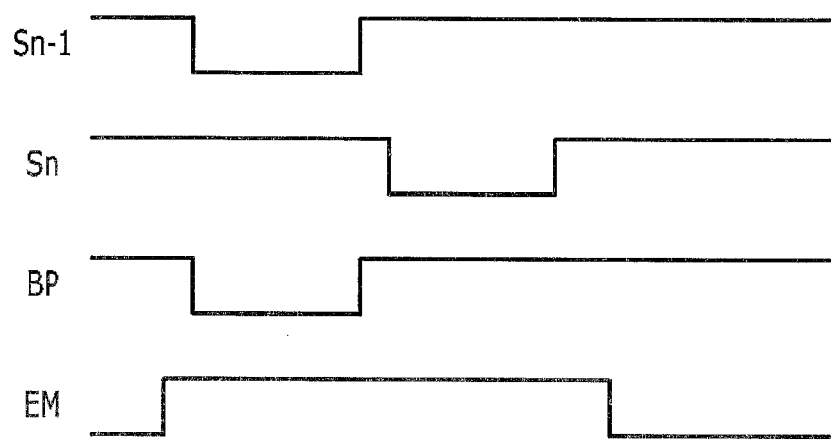
FIG. 3 is a timing diagram of a signal applied to a pixel of an OLED display according to an exemplary embodiment of the present disclosure.

FIG. 3 is a timing diagram of a signal applied to a pixel of an OLED display according to an exemplary embodiment of the present disclosure.

As illustrated in FIG. 3, the low-level previous scan signal Sn−1 is supplied through the previous scan line 152 for an initialization period. Next, the initialization transistor T4 is turned on depending on the low-level previous scan signal Sn−1, the initialization voltage Vint is connected to the gate electrode G1 of the driving transistor T1 from the initialization voltage line 192 through the initialization transistor T4, and the driving transistor T1 is initialized by the initialization voltage Vint.

Next, the low-level scan signal Sn is supplied through the scan line 151 for a data programming period.

Next, the switching transistor T2 and the compensation transistor T3 are turned on depending on the low-level scan signal Sn.

In this case, the driving transistor T1 is diode-connected by the turned on compensation transistor T3 and is biased forward.

Next, a compensation voltage Dm+Vth (Vth is a negative value), which is reduced by as much as a threshold voltage (Vth) of the driving transistor T1 from the data signal Dm supplied from the data line 171, is applied to the gate electrode G1 of the driving transistor T1.

That is, the gate voltage Vg applied to the gate electrode G1 of the driving transistor T1 is the compensation voltage Dm+Vth.

The driving voltage ELVDD and the compensation voltage Dm+Vth are applied to respective ends of the storage capacitor Cst, and a charge corresponding to a voltage difference between both ends is stored in the storage capacitor Cst.

Next, the light control signal EM supplied from the light emission control line 153 is changed from a high level to a low level for a light emission period.

Next, the operation control transistor T5 and the light control transistor T6 are turned on by the low-level light emission control signal EM for the light emission period.

Next, a driving current Id corresponding to a voltage difference between the gate voltage Vg of the gate electrode G1 of the driving transistor T1 and the driving voltage ELVDD is generated, and the driving current Id is supplied to the OLED through the light emission control transistor T6.

A driving gate-source voltage Vgs of the driving transistor T1 is maintained at '(Dm+Vth)−ELVDD' by the storage capacitor Cst for the light emission period, and according to a current-voltage relationship of the driving transistor T1, the driving current Id is proportional to a square '(Dm−ELVDD)$^2$' of a value obtained by subtracting the threshold voltage from the driving gate-source voltage Vgs.

Therefore, the driving current Id is determined regardless of the threshold voltage Vth of the driving transistor T1.

In this case, the bypass transistor T7 receives a bypass signal BP from the bypass control line 158. Accordingly, the driving current Id is partially discharged through the bypass transistor T7 as a bypass current Ibp.

When the OLED emits light even though a minimum current of the driving transistor T1 displaying a black image flows as a driving current, the black image is not properly displayed. Therefore, the bypass transistor T7 may disperse some of the minimum current of the driving transistor T1 to current paths other than a current path to the OLED as the bypass current Ibp. Here, the minimum current of the driving transistor T1 means a current for which the driving gate-source voltage Vgs of the driving transistor T1 is smaller than the threshold voltage Vth, and thus the driving transistor T1 is turned off. The minimum driving current (e.g., a current which is equal to or less than 10 pA) for which the driving transistor T1 is turned off is transmitted to the OLED and is represented by an image of black luminance.

When the minimum driving current representing the black image flows, the effect of the bypass transfer of the bypass current Ibp is significant, but when a large driving current representing an image like a general image or a white image flows, an effect of the bypass current Ibp may be minimal. Therefore, when the driving current representing the black image flows, a light-emitting current Ioled of the OLED, which is reduced by as much as a current amount of the bypass current Ibp exiting from the driving current Id through the bypass transistor T7, has a minimum current amount that is at a level sufficient to represent the black image. Therefore, an accurate black luminance image is achieved by using the bypass transistor T7 to improve the contrast ratio. In FIG. 2, the bypass signal BP is the same as the previous scan signal Sn−1, but is not necessarily limited thereto.

Next, a detailed structure of the OLED display shown in FIGS. 1, 2, and 3 will be described in detail with reference to FIGS. 4, 5, 6, 7, and 8.

Figure 4:
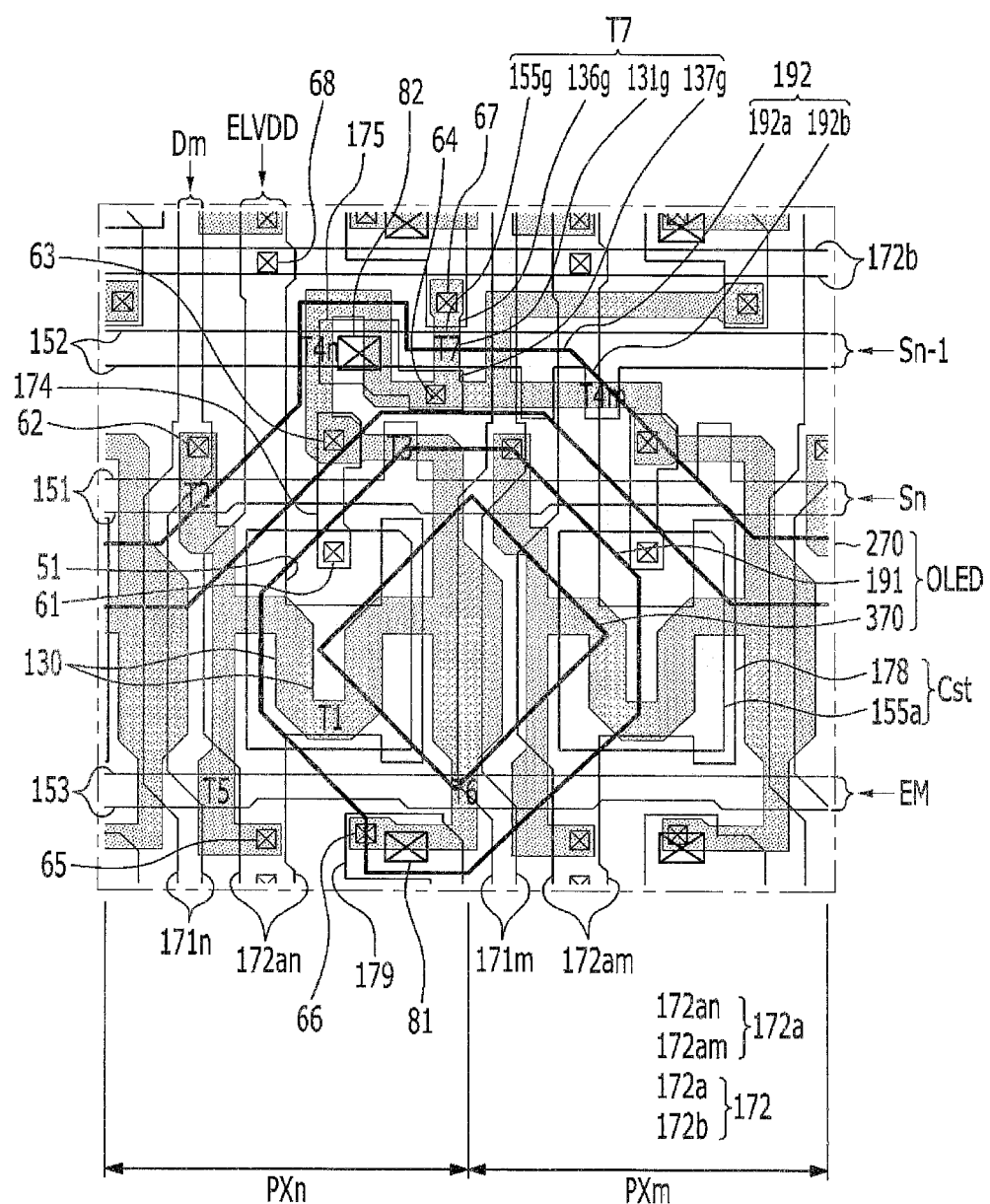
FIG. 4 is a schematic layout view of a plurality of transistors and a capacitor of an OLED display according to an exemplary embodiment of the present disclosure.
Figure 5:
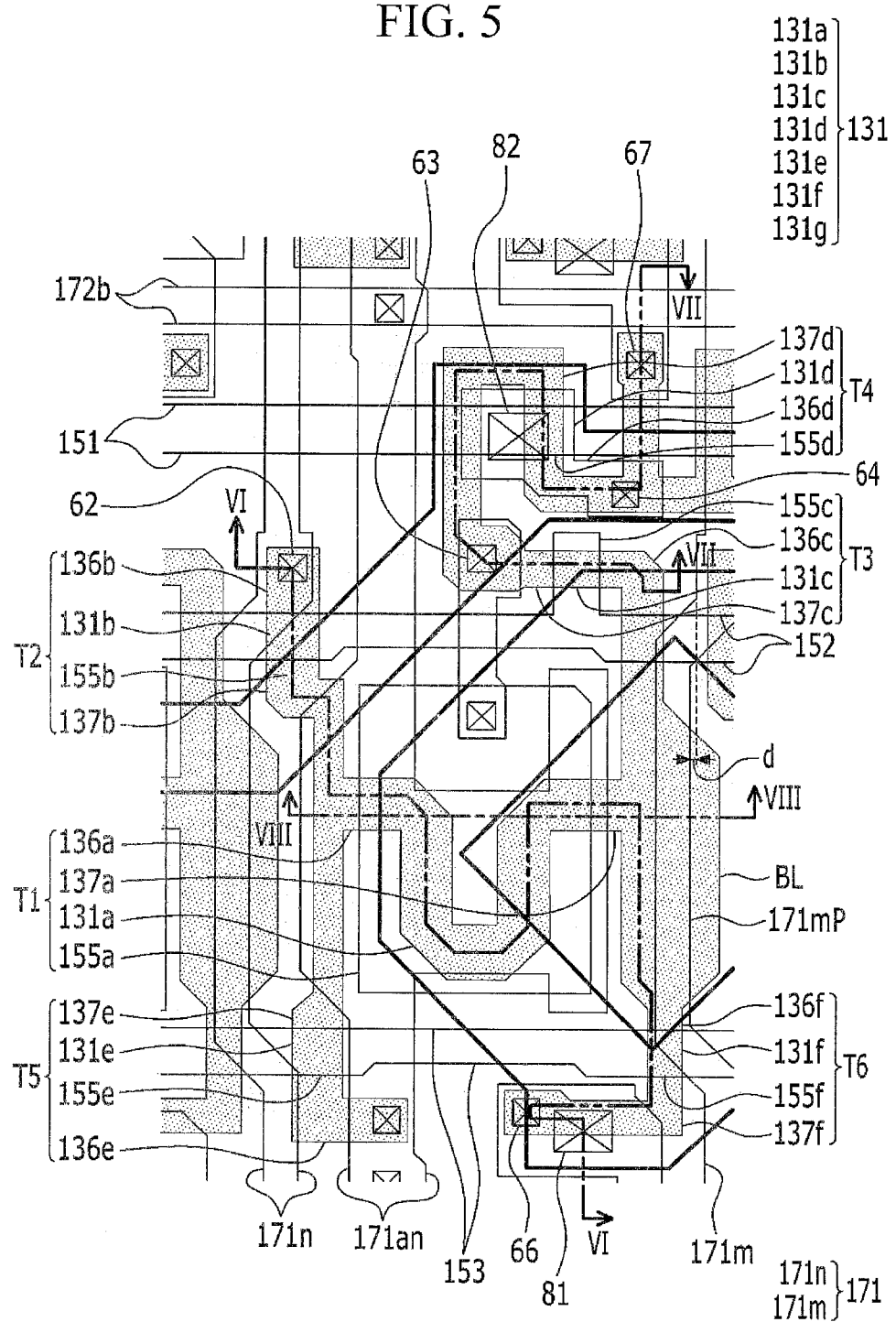
FIG. 5 is a detailed layout view of FIG. 4.
Figure 6:
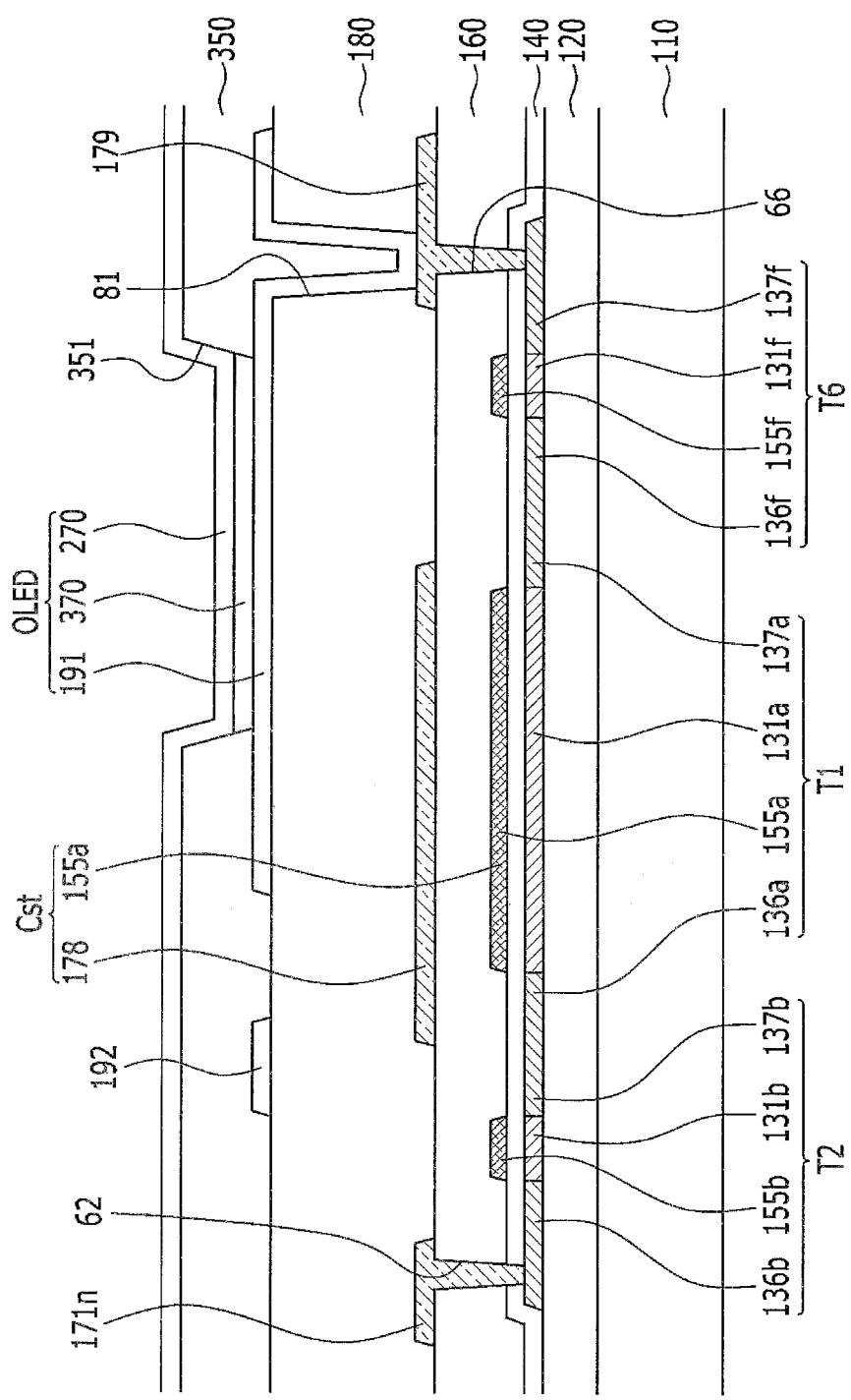
FIG. 6 is a cross-sectional view of the OLED display of FIG. 5 taken along line VI-VI.
Figure 7:
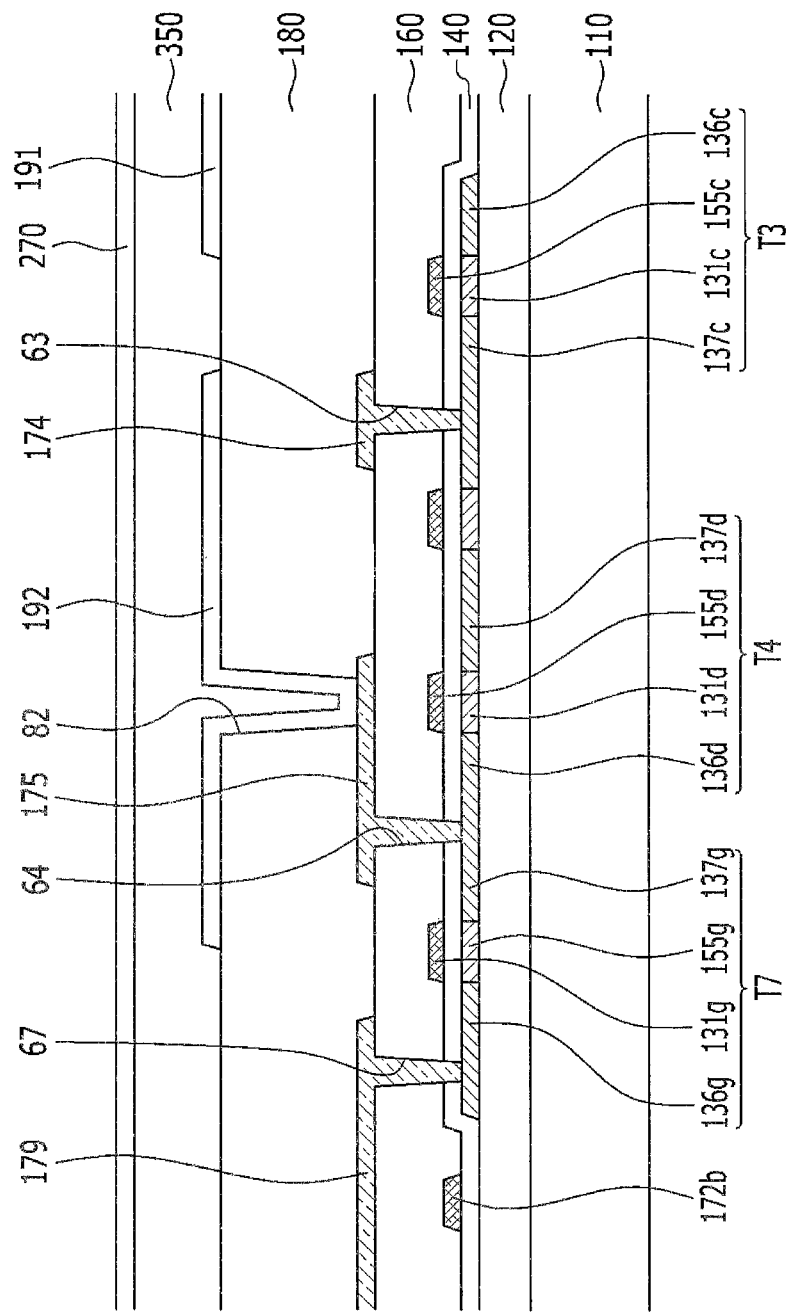
FIG. 7 is a cross-sectional view of the OLED display of FIG. 5 taken along line VII-VII.
Figure 8:
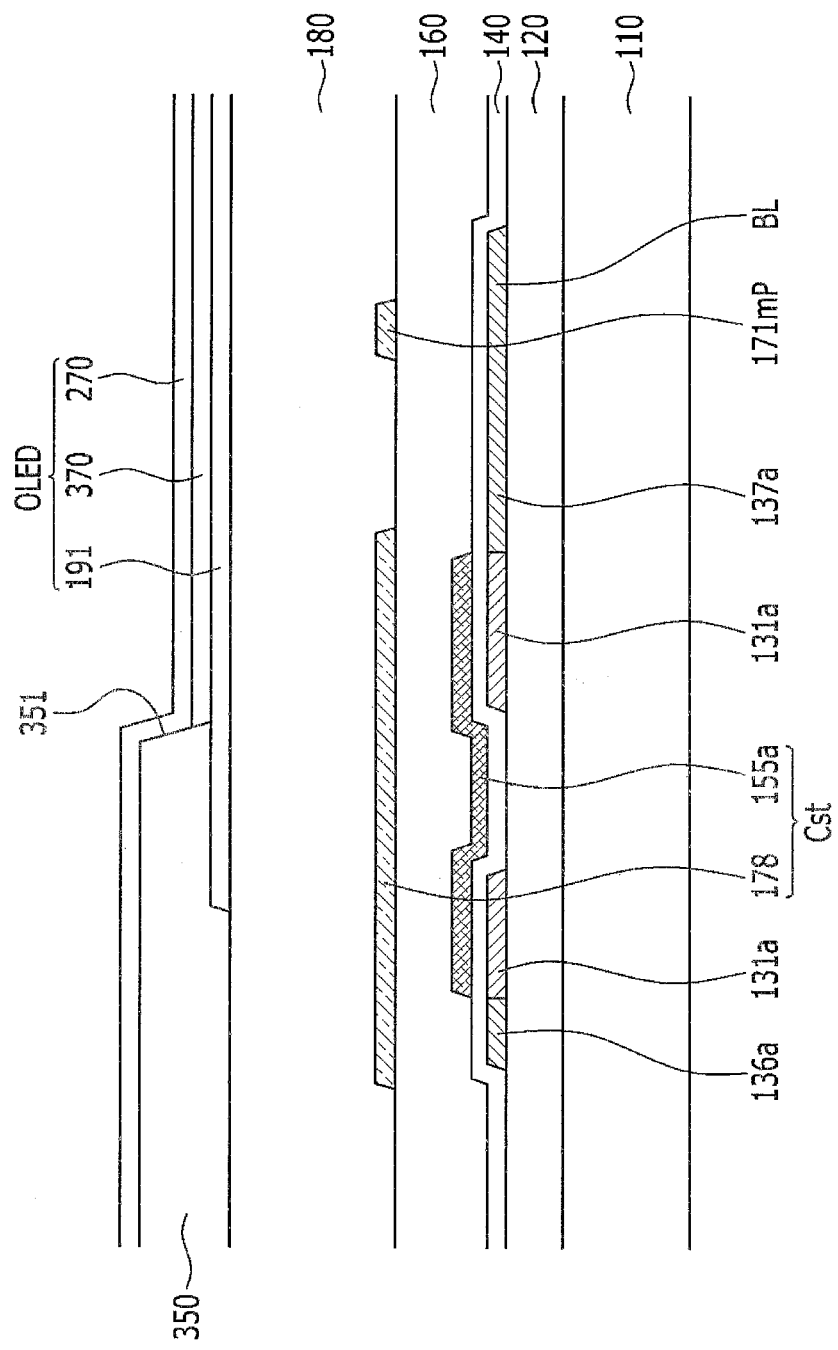
FIG. 8 is a cross-sectional view of the OLED display of FIG. 5 taken along line VIII-VIII.

FIG. 4 is a schematic layout view of a plurality of transistors and a capacitor of an OLED display according to an exemplary embodiment of the present disclosure, FIG. 5 is a detailed layout view of FIG. 4, FIG. 6 is a cross-sectional view of the OLED display of FIG. 5 taken along line VI-VI, FIG. 7 is a cross-sectional view of the OLED display of FIG. 5 taken along line VII-VII, and FIG. 8 is a cross-sectional view of the OLED display of FIG. 5 taken along line VIII-VIII.

Hereinafter, a detailed planar structure of the OLED display will be described in detail with reference to FIGS. 4 and 5, and a detailed cross-sectional structure will be described in detail with reference to FIGS. 6, 7, and 8.

As shown in FIGS. 4 and 5, the OLED display includes the scan line 151, the previous scan line 152, and the light emission control line 153, which respectively transmit the scan signal Sn, the previous scan signal Sn−1, and the light emission control signal EM, and which are disposed in a row direction.

Since the bypass control signal BP is substantially the same as the previous scan signal Sn−1, a separate bypass control line is not formed and the bypass control signal BP is transmitted through the previous scan line 152.

Also, the data line 171 and the driving voltage line 172 crossing the scan line 151, the previous scan line 152, and the light emission control line 153, respectively transmitting the data signal Dm and the driving voltage ELVDD to the pixel PX, may be further included.

The driving voltage line 172 may include a first driving voltage line 172a substantially parallel to the data line 171 and a second driving voltage line 172b substantially parallel to the scan line 151. The first driving voltage line 172a and the second driving voltage line 172b are connected to each other through a contact hole 68.

Accordingly, compared to the case in which the first driving voltage line 172a is only formed to extend in a vertical direction to transmit the driving voltage, an exemplary embodiment of the present disclosure connects the first driving voltage line 172a elongated in a vertical direction and the second driving voltage line 172b elongated in a horizontal direction through the contact hole 68 to form a mesh structure, thereby minimizing the voltage drop of the driving voltage line 172.

Meanwhile, the pixel PX may include a current pixel (PXn), and an adjacent pixel (PXm) adjacent to the current pixel (PXn).

The first driving voltage line 172a may include a current first driving voltage line 172an disposed to the current pixel (PXn), and an adjacent first driving voltage line 172am disposed to the adjacent pixel (PXm) adjacent to the current pixel (PXn).

The initialization voltage Vint may be transmitted from the initialization voltage line 192 via the initialization transistor T4 to the compensation transistor T3.

The initialization voltage line 192 may alternately have a straight portion 192a and an oblique portion 192b.

The straight portion 192a may be disposed to be parallel to the scan line 121, and the oblique portion 192b may extend at a predetermined angle with the straight portion 192a.

Also, the pixel PX may be provided with the driving transistor T1, the switching transistor T2, the compensation transistor T3, the initialization transistor T4, the operation control transistor T5, the light emission control transistor T6, the bypass transistor T7, the storage capacitor Cst, and the OLED.

The OLED may include a pixel electrode 191, an organic emission layer 370, and a common electrode 270. In this case, the compensation transistor T3 and the initialization transistor T4 may be configured of a transistor having a dual gate structure to cut off current leakage.

Each channel of the driving transistor T1, the switching transistor T2, the compensation transistor T3, the initialization transistor T4, the operation control transistor T5, the light emission control transistor T6, and the bypass transistor T7 may be formed inside one connected semiconductor member 130, which may be bent in various shapes. The semiconductor member 130 may be made of polysilicon or an oxide semiconductor. The oxide semiconductor may include any one of the oxides based on titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide (InGaZnO4), indium-zinc oxide (In—Zn—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O), which are complex oxides thereof In the case the semiconductor member 130 is made of an oxide semiconductor, a separate passivation layer may be added to protect the oxide semiconductor which is vulnerable to an external environment such as a high temperature.

The semiconductor member 130 may include a channel which is doped with an N-type impurity or a P-type impurity, and a source doping area and a drain doping area which are disposed at respective sides of the channel and have a higher doping concentration than that of the doping impurity doped in the channel. In the exemplary embodiment, the source doping area and the drain doping area may correspond to the source electrode and the drain electrode, respectively. The source electrode and the drain electrode disposed in the semiconductor member 130 may be formed by doping only the corresponding areas. Further, in the semiconductor member 130, an area between the source electrode of one transistor and the drain electrode of another transistor adjacent to the one transistor may be doped, and thus the source electrode and the drain electrode may be electrically connected to each other.

As shown in FIG. 4, a channel 131, which is one area of the semiconductor member 130, may include a driving channel 131a disposed in the drive transistor T1, a switching channel 131b disposed in the switching transistor T2, a compensation channel 131c disposed in the compensation transistor T3, an initialization channel 131d disposed in the initialization transistor T4, an operation control channel 131e disposed in the operation control transistor T5, a light emission control channel 131f disposed in the light emission control transistor T6, and a bypass channel 131g disposed in the bypass transistor T7.

The driving transistor T1 may include the driving channel 131a, a driving gate electrode 155a, a driving source electrode 136a, and a driving drain electrode 137a.

The driving channel 131a may be curved, and may have a meandering shape or a zigzag shape. As such, by forming the curved driving channel 131a, the driving channel 131a may be formed to extend in a narrow space. Accordingly, a driving range of the driving gate-source voltage Vgs between the driving gate electrode 155a and the driving source electrode 136a may be increased by the extended driving channel 131a. Since the driving range of the driving gate-source voltage Vgs is increased, a grayscale of light emitted from the OLED may be finely controlled by changing the magnitude of the driving gate-source voltage Vgs, and as a result, the resolution of the OLED display may be enhanced and display quality may be improved. Various examples such as a 'reverse S', 'S', 'M', and 'W' may be implemented by variously modifying the shape of the driving channel 131a.

The driving gate electrode 155a may overlap the driving channel 131a, and the driving source electrode 136a and the driving drain electrode 137a may be disposed to be adjacent to respective sides of the driving channel 131a. The driving gate electrode 155a may be connected to a driving connecting member 174 through a contact hole 61.

The switching transistor T2 may include the switching channel 131b, a switching gate electrode 155b, a switching source electrode 136b, and a switching drain electrode 137b. The switching gate electrode 155b, which is an area of the scan line 151, may overlap the switching channel 131b, and the switching source electrode 136b and the switching drain electrode 137b are disposed to be adjacent to respective sides of the switching channel 131b. The switching source electrode 136b may be connected to the data line 171 through a contact hole 62.

The compensation transistor T3 may include the compensation channel 131c, a compensation gate electrode 155c, a compensation source electrode 136c, and a compensation drain electrode 137c.

The compensation gate electrode 155c, which is another area of the scan line 151, may be formed as two in order to prevent current leakage, and it may overlap the compensation channel 131c.

The compensation source electrode 136c and the compensation drain electrode 137c may be disposed to be adjacent to respective sides of the compensation channel 131c. The compensation drain electrode 137c may be connected to the driving connecting member 174 through a contact hole 63.

The initialization transistor T4 may include the initialization channel 131d, an initialization gate electrode 155d, an initialization source electrode 136d, and an initialization drain electrode 137d. The initialization gate electrode 155d, which is an area of the previous scan line 152, may be disposed as two in order to prevent current leakage, and it may overlap the initialization channel 131d. The initialization source electrode 136d and the initialization drain electrode 137d may be disposed to be adjacent to respective sides of the initialization channel 131d. The initialization source electrode 136d may be connected to an initialization connecting member 175 through a contact hole 64.

The operation control transistor T5 may include the operation control channel 131e, an operation control gate electrode 155e, an operation control source electrode 136e, and an operation control drain electrode 137e. The operation control gate electrode 155e, which is an area of the light emission control line 153, may overlap the operation control channel 131e, and the operation control source electrode 136e and the operation control drain electrode 137e may be disposed to be adjacent to respective sides of the operation control channel 131e. The operation control source electrode 136e may be connected to an area of the driving voltage line 172 through a contact hole 65.

The light emission control transistor T6 may include the light emission control channel 131f, a light emission control gate electrode 155f, a light emission control source electrode 136f, and a light emission control drain electrode 137f.

The light emission control gate electrode 155f, which is another area of the light emission control line 153, may overlap the light emission control channel 131f, and the light emission control source electrode 136f and the light emission control drain electrode 137f may be disposed to be adjacent to respective sides of the light emission control channel 131f. The light emission control drain electrode 137f may be connected to a pixel connecting member 179 through a contact hole 66.

The bypass transistor T7 may include the bypass channel 131g, a bypass gate electrode 155g, a bypass source electrode 136g, and a bypass drain electrode 137g.

The bypass gate electrode 155g, which is another area of the previous scan line 152, may overlap the bypass channel 131g, and the bypass source electrode 136g and the bypass drain electrode 137g may be disposed to be adjacent to respective sides of the bypass channel 131g.

The bypass source electrode 136g may be connected directly to the light emission control drain electrode 137f, and the bypass drain electrode 137g may be connected to the initialization connecting member 175 through a contact hole 67.

One terminal of the driving channel 131a of the driving transistor T1 may be connected to the switching drain electrode 137b and the operation control drain electrode 137e, and the other terminal of the driving channel 131a may be connected to the compensation source electrode 136c and the light emission control source electrode 136f.

The capacitor Cst may include the first storage electrode 155a and a second storage electrode 178, with an interlayer insulating layer 160 disposed therebetween.

The first storage electrode 155a may correspond to the driving gate electrode 155a, while the second storage electrode 178 may be a portion expanding from the first driving voltage line 172a, and may be formed one per pixel.

Here, the interlayer insulating layer 160 may be a dielectric material, and storage capacitance may be determined by a charge charged in the storage capacitor Cst and a voltage between both electrodes 155a and 178. As such, the driving gate electrode 155a may be used as the first storage electrode 155a, and thus a space for forming the storage capacitor may be secured in a space that is narrowed due to the driving channel 131a occupying a large area within the pixel.

The first storage electrode 155a, which is the driving gate electrode 155a, may be connected to one terminal of the driving connecting member 174 through the driving contact hole 61 and a storage opening 51.

The storage groove 51 may be a groove formed in the second storage electrode 178.

Accordingly, the contact hole 61 connecting one end of the driving connecting member 174 and the driving gate electrode 155a may be disposed inside the storage groove 51.

The driving connecting member 174 may be nearly parallel to the data line 171 and may be disposed on the same layer as the data line 171, and the other end of the driving connecting member 174 may be connected to the compensation drain electrode 137c of the compensation transistor T3 and the initialization drain electrode 137d of the initialization transistor T4 through the contact hole 63.

Accordingly, the driving connecting member 174 may connect the driving gate electrode 155a and the compensation drain electrode 137c of the compensation transistor T3 and the initialization drain electrode 137d of the initialization transistor T4 to each other.

The driving connecting member 174 may correspond to a driving gate node GN in the equivalent circuit diagram of FIG. 1.

The second storage electrode 178 may be an expansion extending from the first driving voltage line 172a, and is disposed on the driving gate electrode 155a.

Accordingly, the storage capacitor Cst may store the storage capacitance corresponding to a difference between the driving voltage ELVDD transmitted to the second storage electrode 178 through the driving voltage line 172 and the gate voltage Vg of the driving gate electrode 155a.

As described above, by forming the portion of the driving voltage line as the second storage electrode 178, it is not necessary for the second storage electrode to be formed as a separate layer, and the number of masks used in the manufacturing thereof may be reduced.

In this case, a total of 7 masks are used from the semiconductor 130 to the common electrode 270, and this manufacturing method is referred to as a 7 mask process, while the structure of the OLED display manufactured by the 7 mask process is referred to as a 7 mask structure.

The data line 171 may cross the scan line 151 and may extend in the column direction.

The data line 171 may include a current data line 171n transmitting a data signal Dm to the current pixel PXn, and an adjacent data line 171m transmitting an adjacent data signal D(m+1) to the adjacent pixel PXm.

A blocking member BL may be formed to extend from the driving drain electrode 137a.

In this case, a portion 171mp of the adjacent data line 171m between the previous scan line 152 and the light emission control line 153 is shifted by a predetermined interval d1 toward the current pixel PXn.

Accordingly, the adjacent data line 171m may at least partially overlap the blocking member BL of the current pixel PXn in the depth dimension of the OLED display.

As described above, by overlapping the blocking member BL extending from the driving drain electrode 137a of the current pixel PXn with the adjacent data line 171m of the adjacent pixel PXm, parasitic capacitance formed between an adjacent data line 171m and a driving gate node GN is blocked, thereby preventing vertical crosstalk.

Hereinafter, a role of the blocking member BL will be described in detail. The driving transistor T1 may control the driving current (Id) flowing into the OLED and store a charge corresponding to a difference between the driving voltage ELVDD and the compensation voltage (Dm+Vth) to both ends of the storage capacitor Cst connected to a driving gate node (GN) of the driving transistor T1, thereby maintaining it during 1 frame.

Therefore, the OLED may receive a certain amount of the driving current Id from the driving transistor T1 to emit light during 1 frame.

However, due to parasitic capacitance Cp1 of a parasitic capacitor Cp formed between the driving gate node GN connected to the driving gate electrode 155a of the driving transistor T1, and the data line 171, a voltage change of the data line 171 effects the driving gate voltage Vg, which is a voltage of the driving gate node (GN) of the driving transistor T1.

The relation among the driving gate voltage Vg, the parasitic capacitance Cp 1, the storage capacitance Cst1 of the storage capacitor Cst, and the data voltage Vd may be represented as Equation 1 below.

$$\Delta Vg = Cp1/(Cp1+Cst1) * \Delta Vd \qquad \text{(EQUATION 1)}$$

A change of the driving gate voltage (Vg) changes the driving current (Id) flowing into the OLED A change of the driving current (Id) changes luminance of the OLED.

As described above, a change of luminance due to parasitic capacitance Cp1 formed between the driving gate node GN and the data line 171 is referred to as vertical crosstalk.

However, in an exemplary embodiment of the present disclosure, by overlapping the blocking member BL extending from the driving drain electrode 137a of the current pixel PXn with the adjacent data line 171m of the adjacent pixel PXm, an electric field generated from the adjacent data line 171m is blocked, thereby blocking parasitic capacitance formed between the adjacent data line 171m and the driving gate node GN.

Therefore, vertical crosstalk generating by parasitic capacitance between the driving gate node GN and the adjacent data line 171m may be prevented.

The pixel connecting member 179 may be connected to the pixel electrode 191 through a contact hole 81, and the initialization connecting member 175 may be connected to the initialization voltage line 192 through a contact hole 82.

The initialization transistor T4 may include a current initialization transistor T4n disposed in the current pixel PXn and an adjacent initialization transistor T4m disposed in the adjacent pixel PXm.

In addition, the first driving voltage line 172a may include a current first driving voltage line 172an disposed in the current pixel PXn and an adjacent first driving voltage line 172am disposed in the adjacent pixel PXm.

The current initialization transistor T4n may be separated from the current first driving voltage line 172an in a plan view, and the adjacent initialization transistor T4m overlaps the adjacent first driving voltage line 172am.

As described above, since the current initialization transistor T4n does not overlap the current first driving voltage line 172an, the initialization connecting member 175 can overlap the current initialization transistor T4n.

Therefore, the initialization connecting member 175 may be easily formed in the current pixel PXn.

Hereinafter, the cross-sectional structures of the OLED display according to an exemplary embodiment of the present disclosure will be described in detail according to a stacking order with reference to FIGS. 6, 7, and 8.

In this case, since the stacked structures of the operation control transistor T5 are substantially the same as those of the light emission control transistor T6, a detailed description thereof will be omitted.

A buffer layer 120 may be disposed on a substrate 110. The substrate 110 may be made of an insulating material such as glass, crystal, ceramic, or plastic.

The buffer layer 120 may block impurities from the substrate 110 during a crystallization process for forming polysilicon to serve to improve characteristics of the polysilicon, and may planarize the substrate 110 to mitigate stress of the semiconductor member 130 formed on the buffer layer 120.

The buffer layer 120 may be made of a silicon nitride (SiNx), a silicon oxide (SiOx), or the like.

The semiconductor member 130 including the channel 131, which includes the driving channel 131a, the switching channel 131b, the compensation channel 131c, the initialization channel 131d, the operation control channel 131e, the light emission control channel 131f, and the bypass channel 131g, may be disposed on the buffer layer 120.

The driving source electrode 136a and the driving drain electrode 137a may be disposed at respective sides of the driving channel 131a in the semiconductor member 130, and the switching source electrode 136b and the switching drain electrode 137b may be disposed at respective sides of the switching channel 131b.

The compensation source electrode 136c and the compensation drain electrode 137c may be disposed at respective sides of the compensation channel 131c, and the initialization source electrode 136d and the initialization drain electrode 137d may be disposed at respective sides of the initialization channel 131d.

The operation control source electrode 136e and the operation control drain electrode 137e may be disposed at respective sides of the operation control channel 131e, and the emission control source electrode 136f and the emission control drain electrode 137f may be disposed at respective sides of the emission control channel 131f.

The bypass source electrode 136g and the bypass drain electrode 137g may be disposed at respective sides of the bypass channel 131g.

A first gate insulating layer 140 covering the semiconductor member 130 is disposed thereon.

Gate metal lines 151, 152, 153, and 155a, including the scan line 151, which includes the switching gate electrode 155b and the compensation gate electrode 155c, the previous scan line 152, which includes the initialization gate electrode 155d and the bypass gate electrode 155g, the light emission control line 153, which includes the operation control gate electrode 155e and the light emission control gate electrode 155f, and the driving gate electrode (the first storage electrode) 155a may be disposed on the gate insulating layer 140.

The gate metal lines 151, 152, 153, and 155a may be made of single layer made of any of copper (Cu), a copper alloy, aluminum (Al), an aluminum alloy, molybdenum (Mo), and a molybdenum alloy, or may be made of multiple layers in which metal layers made of any of copper (Cu), a copper alloy, aluminum (Al), an aluminum alloy, molybdenum (Mo), and a molybdenum alloy are stacked.

The interlayer insulating layer 160 covering the gate metal lines 151, 152, 153, and 155a, and the gate insulating layer 140 is disposed thereon.

The interlayer insulating layer 160 may be made of a silicon nitride (SiNx) or a silicon oxide (SiOx).

The interlayer insulating layer 160 has contact holes 61, 62, 63, 64, 65, 66, 67, and 68.

The data metal lines 171, 172, 174, 175, and 179, including a data line 171, a driving voltage line 172, a driving connecting member 174, an initialization connecting member 175, and a pixel connecting member 179, may be disposed on the interlayer insulating layer 160.

The data metal lines 171-179 may be made of multiple layers in which metal layers including any of copper (Cu), a copper alloy, aluminum (Al), an aluminum alloy, molybdenum (Mo), and a molybdenum alloy are stacked, and for example, may be made of a triple layer of titanium/aluminum/titanium (Ti/Al/Ti), a triple layer of molybdenum/aluminum/molybdenum (Mo/Al/Mo), or a triple layer of molybdenum/copper/molybdenum (Mo/Cu/Mo).

The data line 171 is connected to the switching source electrode 136b through the contact hole 62 formed in the gate insulating layer 140 and the interlayer insulating layer 160, and the first driving voltage line 172a partially extends to form the second storage electrode 178.

A portion 171mp of the adjacent data line 171m of the data line 171 overlaps the blocking member BL expanding from the driving drain electrode 137a of the current pixel PXn, such that parasitic capacitance formed between the adjacent data line 171m and the driving gate node GN is blocked to prevent vertical crosstalk.

One end of the driving connecting member 174 is connected to the first storage electrode 155a through the contact hole 61 formed in the interlayer insulating layer 160, and the other end of the driving connecting member 174 is connected to the compensation drain electrode 137c and the initialization drain electrode 137d through the contact hole 63 formed in the gate insulating layer 140 and the interlayer insulating layer 160.

The initialization connecting member 175 is connected to the initialization source electrode 136d through the contact hole 64 formed in both the gate insulating layer 140 and the interlayer insulating layer 160.

Also, the pixel connecting member 179 is connected to the light emission drain electrode 137f through the contact hole 66 formed in both the gate insulating layer 140 and the interlayer insulating layer 160.

A passivation layer 180 covering the data metal lines 171-179, and the interlayer insulating layer 160, is disposed thereon.

The passivation layer 180 covers the metal data lines 171-179 to be flattened, so that the pixel electrode 191 may be formed on the passivation layer 180 without a step. The passivation layer 180 may be made of a stacked layer of an organic material such as a polyacrylate resin, a polyimide resin, or the like, or a stacked layer of an organic material and an inorganic material.

The pixel electrode 191 and the initialization voltage line 192 are disposed on the passivation layer 180.

The pixel connecting member 179 is connected to the pixel electrode 191 through the contact hole 81 formed in the passivation layer 180, and the initialization connecting member 175 is connected to the initialization voltage line 192 through the contact hole 82 formed in the passivation layer 180.

A pixel definition layer (PDL) 350 covering the passivation layer 180, the initialization voltage line 192, and the edge of the pixel electrode 191 is disposed thereon, and the pixel definition layer 350 has a pixel opening 351. The pixel definition layer 350 may be made of organic materials such as a polyacrylate resin, a polyimide resin, and the like, and silica-based organic materials.

The organic emission layer 370 is disposed on the pixel electrode 191, and the common electrode 270 is disposed on the organic emission layer 370.

The common electrode 270 is also disposed on the pixel defined layer 350 over the plurality of pixels PX.

As described above, the OLED including the pixel electrode 191, the organic emission layer 370, and the common electrode 270 is formed.

Here, the pixel electrode 191 is an anode, which is a hole injection electrode, and the common electrode 270 is a cathode, which is an electron injection electrode.

However, the exemplary embodiment according to the present disclosure is not necessarily limited thereto, and the pixel electrode 191 may be the cathode and the common electrode 270 may be the anode.

Holes and electrons are injected into the organic emission layer 370 from the pixel electrode 191 and the common electrode 270, respectively. When excitons acquired by combining the injected holes and electrons fall from an excitation state to a ground state, light is emitted in the organic emission layer 370.

The organic emission layer 370 may be made of a low-molecular organic material or a high-molecular organic material, such as poly(3,4-ethylenedioxythiophene) (PEDOT).

Further, the organic emission layer 370 may be formed with multiple layers, including at least one of an emission layer, a hole injection layer (HIL), a hole transporting layer (HTL), an electron transporting layer (ETL), and an electron injection layer (EIL).

When the organic emission layer 370 include all of the layers, the hole injection layer is disposed on the pixel electrode 191, which is the positive electrode, and the hole transporting layer, the light emission layer, the electron transporting layer, and the electron injection layer are sequentially laminated thereon.

The organic emission layer 370 may include a red organic emission layer emitting red light, a green organic emission layer emitting green light, and a blue organic emission layer emitting blue light, and the red organic emission layer, the green organic emission layer, and the blue organic emission layer are formed at a red pixel, a green pixel, and a blue pixel, respectively, to implement color images.

Further, in the organic emission layer 370, all of the red organic emission layer, the green organic emission layer, and the blue organic emission layer are laminated together on the red pixel, the green pixel, and the blue pixel, and a red color filter, a green color filter, and a blue color filter are formed for each pixel to implement the color images.

As another example, a white organic emission layer emitting white light is formed on all of the red pixel, the green pixel, and the blue pixel, and the red color filter, the green color filter, and the blue color filter are formed for each pixel to implement the color images.

When the color images are implemented by using the white organic emission layer and the color filters, a deposition mask for respectively depositing the red organic emission layer, the green organic emission layer, and the blue organic emission layer on individual pixels, i.e., the red pixel, the green pixel, and the blue pixel, may not be used.

The white organic emission layer described in another example may, of course, be formed by one organic emission layer, and it even includes a configuration that may emit white light by laminating a plurality of organic emission layers.

As an example, the white organic emission layer may include a configuration that enables the white light to be emitted by combining at least one yellow organic emission layer and at least one blue organic emission layer, a configuration that enables the white light to be emitted by combining at least one cyan organic emission layer and at least one red organic emission layer, a configuration that enables the white light to be emitted by combining at least one magenta organic emission layer and at least one green organic emission layer, and the like.

An encapsulation member (not shown) protecting the OLED may be formed on the common electrode 270, and the encapsulation member may be sealed to the substrate 110 by a sealant and may be formed of various materials such as glass, quartz, ceramic, plastic, and metal.

On the other hand, a thin film encapsulation layer may be formed on the common electrode 270 by depositing the inorganic layer and the organic layer with the usage of the sealant.

While the inventive technology has been described in connection with exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. An organic light-emitting diode (OLED) display comprising:
   a substrate;
   a scan line disposed on the substrate and configured to transmit a scan signal;
   a data line crossing the scan line and configured to transmit a data voltage;
   a driving voltage line crossing the scan line and configured to transmit a driving voltage;
   a switching transistor connected to the scan line and the data line;
   a driving transistor connected to the switching transistor and including a driving gate electrode, a driving source electrode, and a driving drain electrode, wherein the driving gate electrode is configured to function as a first storage electrode;
   a second storage electrode overlapping the first storage electrode and an expansion portion of the driving voltage line in the depth dimension of the OLED display;
   an OLED electrically connected to the driving transistor; and
   a blocking layer extending from the driving drain electrode and overlapping a portion of the data line in the depth dimension of the OLED display.

2. The OLED display of claim 1, wherein the data line includes a current data line configured to transmit a data signal to a current pixel and an adjacent data line configured to transmit an adjacent data signal to an adjacent pixel adjacent to the current pixel, and wherein the blocking layer overlaps a portion of the adjacent data line in the depth dimension of the OLED display.

3. The OLED display of claim 2, wherein the adjacent data line is shifted to the blocking layer.

4. The OLED display of claim 2, further comprising:
   a semiconductor member disposed on the substrate and including a switching channel of the switching transistor and a driving channel of the driving transistor separated from each other,
   wherein the driving channel overlaps the driving gate electrode in the depth dimension of the OLED display and wherein the driving channel is curved in a plan view.

5. The OLED display of claim 4, wherein the blocking layer is disposed on the same layer as the driving channel.

6. The OLED display of claim 5, further comprising:
   a gate insulating layer covering the semiconductor member; and an interlayer insulating layer covering the gate insulating layer, wherein the scan line is disposed on the same layer as the first storage electrode, and wherein the data line and the second storage electrode are disposed on the interlayer insulating layer.

7. The OLED display of claim 6, wherein the driving voltage line includes a first driving voltage line parallel with the data line and a second driving voltage line crossing the data line, wherein the first driving voltage line is disposed on the same layer as the data line and wherein the second driving voltage line is disposed on the same layer as the scan line.

8. The OLED display of claim 7, wherein the OLED includes:
a pixel electrode electrically connected to the driving transistor;
an organic emission layer disposed on the pixel electrode; and
a common electrode disposed on the organic emission layer,
wherein the OLED display further comprises an initialization voltage line disposed on the same layer as the pixel electrode and configured to transmit an initialization voltage initializing the driving transistor.

9. The OLED display of claim 8, further comprising:
a previous scan line parallel with the scan line and configured to transmit a previous scan signal; and
an initialization transistor turned on according to the previous scan signal and configured to transmit the initialization voltage to the driving gate electrode,
wherein the initialization transistor is disposed in a current flow path between the initialization voltage line and the driving gate electrode.

10. The OLED display of claim 9, wherein: the initialization transistor includes a current initialization transistor disposed in the current pixel and an adjacent initialization transistor disposed in the adjacent pixel, wherein the first driving voltage line includes a current first driving voltage line disposed in the current pixel and an adjacent first driving voltage line disposed in the adjacent pixel, and wherein the current initialization transistor is separated from the current first driving voltage line in a plan view and the adjacent initialization transistor overlaps the adjacent first driving voltage line in the depth dimension of the OLED display.

11. The OLED display of claim 1, wherein the driving drain electrode has two opposing ends, and wherein the blocking layer extends from only one of the two ends of the driving drain electrode.

12. The OLED display of claim 1, wherein the blocking layer extends in a direction to be farther away from the first storage electrode.

13. The OLED display of claim 1, wherein the blocking layer does not overlap the second storage electrode in the depth dimension of the OLED display.

14. The OLED display of claim 1, wherein the blocking layer at least partially overlaps the OLED in the depth dimension of the OLED display.

15. The OLED display of claim 1, wherein the blocking layer has a thickness which is the same as that of the driving drain electrode.

16. The OLED display of claim 1, wherein the blocking layer and the driving drain electrode are covered by the same insulating layer.

17. An organic light-emitting diode (OLED) display comprising:
a data line configured to transmit a data voltage;
a driving voltage line configured to transmit a driving voltage;
a driving transistor including a driving gate electrode, a driving source electrode, and a driving drain electrode, wherein the driving gate electrode is configured to function as a first storage electrode;
a second storage electrode overlapping the first storage electrode and an expansion portion of the driving voltage line in the depth dimension of the OLED display;
an OLED electrically connected to the driving transistor; and
a blocking layer extending from the driving drain electrode and overlapping a portion of the data line in the depth dimension of the OLED display.

18. The OLED display of claim 17, wherein the driving drain electrode has two opposing ends, and wherein the blocking layer extends only from one of the two ends of the driving drain electrode.

19. The OLED display of claim 17, wherein the blocking layer at least partially overlaps the OLED in the depth dimension of the OLED display.

20. The OLED display of claim 17, wherein the blocking layer and the driving drain electrode are covered by the same insulating layer.

* * * * *